United States Patent [19]
Becker et al.

[11] Patent Number: 5,895,262
[45] Date of Patent: Apr. 20, 1999

[54] METHODS FOR ETCHING FUSE OPENINGS IN A SEMICONDUCTOR DEVICE

[75] Inventors: David S. Becker; Kunal R. Parekh, both of Boise, Id.

[73] Assignee: Micron Technology, Inc., Boise, Id.

[21] Appl. No.: 08/594,908

[22] Filed: Jan. 31, 1996

[51] Int. Cl.[6] .................................................. H01L 29/34
[52] U.S. Cl. .......................... 438/601; 438/132; 438/467
[58] Field of Search ................................. 438/600–601, 438/467, 940, 902, 132; 257/529–530

[56] References Cited

U.S. PATENT DOCUMENTS

| | | | |
|---|---|---|---|
| 4,455,194 | 6/1984 | Yabu et al. | 156/653 |
| 4,536,949 | 8/1985 | Takayama et al. | 438/601 |
| 5,041,897 | 8/1991 | Machida et al. | 257/529 |

*Primary Examiner*—Jey Tsai
*Attorney, Agent, or Firm*—Workman, Nydegger & Seeley

[57] ABSTRACT

An etch of a fuse opening in overlying layers above a laser-blowable semiconductor fuse having a silicon nitride cap and silicon nitride spacers begins with a silicon nitride that is enclosed in a polysilicon conductive layer on a semiconductor wafer. The etch is performed by etching first with an etch process that etches silicon nitride and later with an etch process that is selective to silicon nitride. The later etch process etches the silicon nitride of the cap and spacers little or not at all, allowing a wider variation in etch depths without destroying the fuse. Also, a patch may be provided in the overlying layers above the fuse, and an etch process employed at the level of the patch that is selective to a material of the patch, resulting in an etch stop effect at that level. The etch process is then changed to an etch process that is not selective to a material of the patch, resulting in decreased variation in etch depth over the surface of the wafer. The etch of the fuse opening is then completed with an etch process that is selective to silicon nitride, again allowing a wider variation in etch depths without destroying the fuse. The etch process that is not selective to a material of the patch and the etch process that is selective to silicon nitride may optionally be one process.

48 Claims, 3 Drawing Sheets

METHODS FOR ETCHING FUSE OPENINGS IN A SEMICONDUCTOR DEVICE

BACKGROUND OF THE INVENTION

1. The Field of the Invention

The present invention relates to the manufacture of semiconductor devices. More particularly, the present invention is directed to improved methods for etching fuse openings in the manufacture of semiconductor devices.

2. The Relevant Technology

In order to improve yield in the manufacture of semiconductor devices, redundant circuit elements may be provided in a circuit layout. The redundant elements may be selectively connected to or disconnected from the circuit as needed to replace defective circuit elements by selectively blowing fuses in the circuit. In highly dense memory circuits, for example, spare rows and columns are formed during fabrication. If a defective bit is found during testing, a spare row or column is substituted for the defective bit by selectively blowing fuses included in the circuit for that purpose.

In state of the art memory circuit layouts, laser fuses take the form of sections of gate stacks including a polysilicon conductive layer. The stack is enclosed laterally by dielectric spacers and upwardly by a dielectric cap. A fuse is "blown" by irradiating the dielectric cap from above with laser radiation at a selected location along the gate stack. The polysilicon is heated by the laser radiation and expands, popping off the dielectric cap at the selected location, and the polysilicon is vaporized or burned off, creating a break in the conductive polysilicon layer.

Fabrication of reliable gate stack type fuses is complicated by the thickness of the overlying layers. As much as 30,000 to 40,000 Angstroms or more of overlying layers must be removed to expose the dielectric cap of the gate stack so that laser radiation may be used to blow a fuse. The overlying layers must be removed to within approximately 3000 Angstroms or less of the top of the cap in order for laser irradiation to reliably blow a selected fuse. But at etch depths as great as 30,000 or 40,000 Angstroms, variations in etch rate over the surface of a wafer, together with variations over the surface of the wafer in the layers to be etched resulting from previous process steps, can result in a difference as large as 6500 Angstroms or more between the deepest and shallowest effective depth of the etch. Etching too deep may destroy the gate stack or expose the substrate, allowing contamination and shorting. Etching not deep enough results in fuses that cannot be reliably blown.

Etching fuse openings thus typically requires painstaking control, such as a timed etch followed by an etch depth measurement for every wafer, followed by a second timed etch for a time calculated individually for each wafer. This type of control is cumbersome and time consuming. Even with control of this type, achieving an etch depth within process limits across the entire surface of a wafer is not always possible. Hence an improved method of etching fuse openings in a semiconductor device is needed.

SUMMARY AND OBJECTS OF THE INVENTION

An object of the present invention is to provide a reliable, easily performed method of etching fuse openings in a semiconductor device to etch depths within process limits.

Another object of the present invention is to provide a method for etching fuse openings in a semiconductor device providing increased uniformity of etch depth across the surface of a wafer.

Yet another object of the present invention is to provide a method for etching fuse openings in a semiconductor device providing increased uniformity of etch depth across the surface of a wafer, which method is easily integrated into standard process flows.

Still another object of the present invention is to provide a method for etching fuse openings in a semiconductor device providing increased uniformity of etch depth across the surface of a wafers which method also provides an increase in the process limits.

Still another object of the present invention is to increase yield in the manufacture of a circuit device by providing an improved method of etching fuse openings, which method increased the number of fuses per wafer which can successfully be blown.

In accordance with one embodiment of the present invention, a silicon nitride cap and silicon nitride spacers are employed on a gate stack serving as a fuse. The etch of the fuse opening is then performed by first etching with an etch process that etches both silicon nitride and silicon oxide, then later etching with an etch process that is selective to silicon nitride. The later etch process etches the silicon nitride of the cap and spacers on the gate stack little or not at all, allowing a wider variation in etch depths without destroying the gate stack. Thus the process limits are increased, and the etch of the fuse opening is more easily kept within those limits.

In accordance with another embodiment of the present invention, a silicon nitride cap and silicon nitride spacers are employed on the gate stack serving as a fuse, and a patch is provided in the overlying layers above the gate stack serving as a fuse. The steps for etching the fuse opening are then so arranged that, at the time the patch is reached, an etch process is used that is selective to a material of the patch, resulting in an etch stop effect at the level of the patch. The etch process is then changed to an etch process that is not selective to the patch. The etch of the fuse opening is then completed with an etch process that is selective to silicon nitride so as to stop at the cap and spacers on the gate stack. In addition to allowing wider variation in etch depths by protecting the gate stack, this embodiment and variations thereof decrease the variation in the etch depth over the surface of a wafer.

Both embodiments summarized above increase the reliability of the fuse opening etch, providing increased yield and tighter, more easily maintained process control.

These and other objects and features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages and objects of the invention are obtained may be more fully explained, a more particular description of the invention briefly described above will be rendered by reference to specific applications thereof which are illustrated in the appended drawings. Understanding that these drawings depict only typical applications of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

As an overview, the present invention provides methods of etching fuse openings during the manufacture of a semiconductor device, which methods improve the reliability of the fuse opening etch. Each of the methods includes providing a gate stack serving as a fuse with spacers and a cap comprised of silicon nitride, then altering the etch process at some point prior to completion of the etch from an etch process that etches silicon nitride and silicon oxide to an etch process that is selective to silicon nitride. Some methods of the present invention further include providing a patch in the overlying layers above the gate stack serving as a fuse, and then etching, at the time during the etch at which the patch is reached, with an etch process selective to the material of the patch, and, after reaching the patch, switching to an etch process that is not selective to the material of the patch. Various currently preferred embodiments of such methods are described in more detail below.

Figure 1:
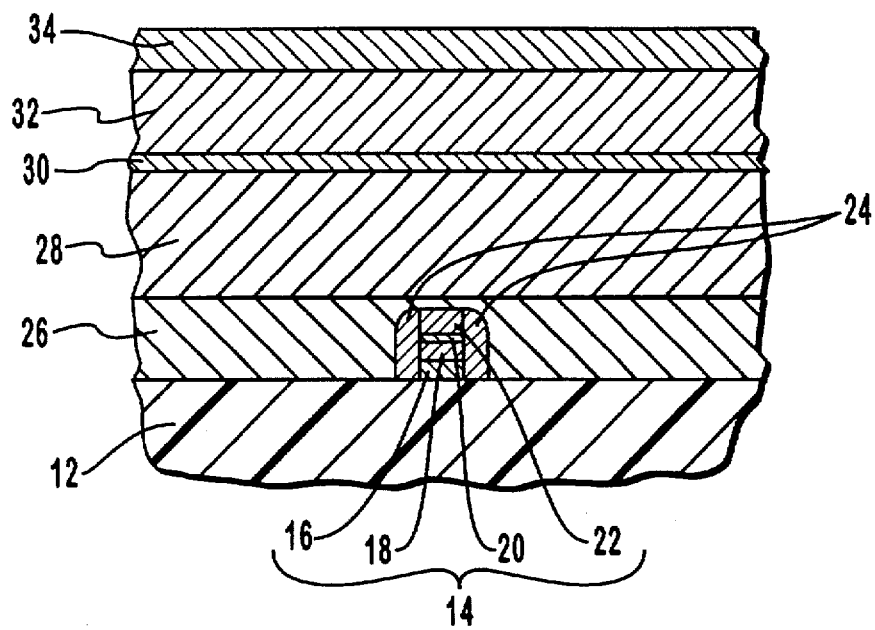
FIG. 1 is a cross section of a partially completed semiconductor device prepared for etching of a fuse opening according to the methods of the present invention.

FIG. 1 shows a cross section of a partially completed semiconductor device prepared for etching of a fuse opening according to one embodiment of the present invention. A gate stack 14 comprising a polysilicon gate 16, a metal silicide layer 18, a thin oxide layer 20 and a silicon nitride cap 22 has been formed on a substrate 12. Gate stack 14 is enclosed by silicon nitride spacers 24. Overlying layers have been deposited over and around gate stack 14. The overlying layers include various silicon oxide layers 26, 28', 30, and 32, which may include such materials as grown silicon oxide, TEOS, BPSG, etc., and silicon oxide and silicon nitride passivation layer 34. A layer of polysilicon which comprises polysilicon gate 16 is conductive and extends, along with the rest of gate stack 14, for a length along a direction perpendicular to the plane of FIG. 1.

Gate stack 14 is intended to act as a fuse. But a fuse opening must be etched in the overlying layers above gate stack 14 before laser irradiation can be used to "blow" the fuse. The total thickness of the layers above nitride cap 22 of gate stack 14 can exceed 30,000 or even 40,000 Angstroms, resulting in significant variations in total etch depth during etching of the fuse opening. Even with lower total thickness of the layers above nitride cap 22, process variations can result in significant variations in total etch depth. If the etch goes too deep, nitride cap 22 and thin oxide layer 20 may be etched away, leaving the conductive metal silicide and polysilicon layers exposed to potential contamination and electrical shorts, and making the fuse difficult to reliably blow. Nitride spacers 24 and silicon oxide layer 26 may even be completely removed at the bottom of an over-etched fuse opening, exposing substrate 12 to possible contamination and electrical shorts. If the etch is not deep enough, the layers overlying nitride cap 22 will prevent nitride cap 22 from popping off, and the polysilicon, even if melted by the laser energy, will remain in place and will remain conductive after cooling, so that the fuse cannot be successfully blown.

According to the embodiment of the present invention employed with the structure shown in FIG. 1, a fuse opening is etched in the overlying layers above gate stack 14 using at least a two-step etch process. Using standard masking technology, a mask is provided on silicon nitride passivation layer 34 to shield areas not to be etched. An opening in the mask is formed over gate stack 14. Openings in the mask will also typically be formed over bonding pad areas, and so that fuse openings in the overlying layers above gate stack 14 and bonding pad openings in silicon nitride and silicon oxide passivation layers 34, 32 may be etched simultaneously. If the bonding pad openings are indeed etched simultaneously with the fuse openings, the etch processes chosen for use must be selective to the material uppermost within the bonding pads, typically aluminum.

Figure 2:
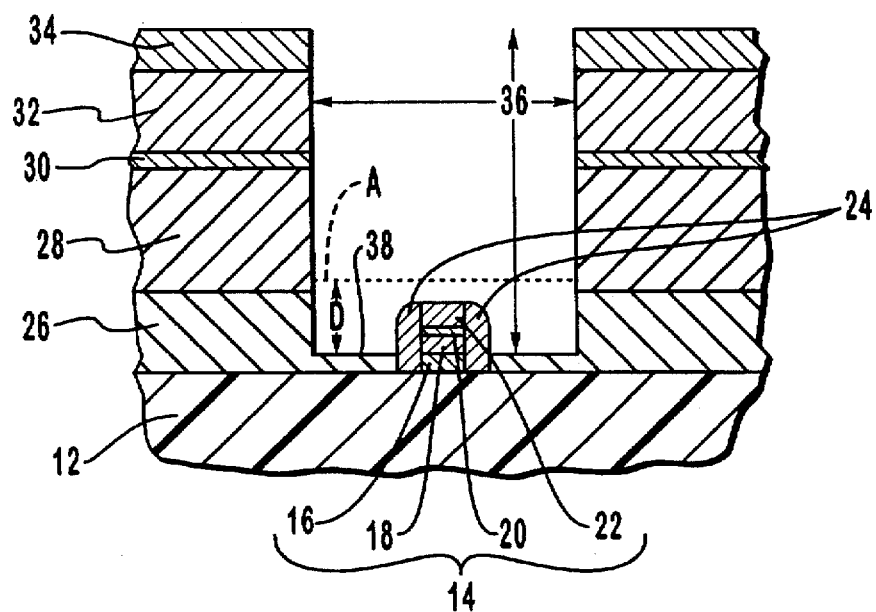
FIG. 2 is a cross section of the structure shown in FIG. 1 after etching of a fuse opening according to the methods of the present invention.

The first step in the at least two-step etch process is etching with an etch process that etches silicon nitride, and preferably etches both silicon nitride and silicon oxide. This step must at least etch through silicon nitride passivation layer 34, and is preferred to etch through silicon nitride passivation layer 34, oxide passivation layer 32, silicon oxide layer 30, and into, but not through, silicon oxide layer 28. A last step in the at least two-step etch process is etching with an etch process that is selective to silicon nitride, i.e., an etch process that etches silicon nitride relatively little or not at all. This last step is preferably accomplished by using a $CH_2F_2/CF_4/CHF_3$/argon chemistry as described in U.S. Pat. No. 5,286,344 entitled "Process of Selectively Etching a Layer of Silicon Dioxide on an Underlying Layer of Silicon Nitride". This last step is applied long enough to extend the opening begun by the first step downward to, at most, the level of a bottom 38 of a fuse opening 36 shown in FIG. 2. At the lowest desirable level as shown in FIG. 2 for bottom 38 of fuse opening 36, at least 2000 Angstroms of silicon oxide layer 26 remain above substrate 12. At the highest desirable level for the bottom of the fuse opening, not more than about 3000 Angstroms of silicon oxide layers 26 and 28 should remain above nitride cap 22. This corresponds to a fuse opening bottom located at dotted line A in FIG. 2.

Without the last step of etching with an etch process selective to silicon nitride, nitride cap 22, thin oxide layer 20, and nitride spacers 24 would begin to be etched away as downward progress of the fuse opening continued below nitride cap 22. Including the last step of etching with an etch process selective to silicon nitride allows the bottom of the fuse opening to extend below nitride cap 22 without damaging gate stack 14. The embodiment of the present invention employed with the structure of FIGS. 1 and 2 thus results in an increase in distance D, the vertical distance between the lowest and highest desirable levels for the bottom of the fuse opening. At some areas of a wafer, the completed fuse etch may stop as high as the level of dotted line A in FIG. 2, while at other areas of the same wafer, the completed fuse etch may reach the depth shown in FIG. 2, where only a relatively small thickness of silicon oxide layer 26 remains at the bottom 38 of fuse opening 36. Thus, the acceptable limits of variation of the fuse opening depth are increased, resulting in easier and more reliable process control.

The first and last steps of the embodiment of the present invention employed with the structure of FIGS. 1 and 2 may be performed in separate pieces of etch equipment, or may be performed in a single piece of etch equipment, or may preferably be performed in situ in a single process chamber by merely varying the etch chemistry appropriately.

The currently preferred method for performing the first step of etching with an etch process that etches silicon nitride includes etching in an Applied Materials 5000, a single wafer plasma etching apparatus manufactured by Applied Materials of Santa Clara, Calif. The currently preferred process parameters include etching at a pressure of 150 mTorr, a power level of 700W, a magnetic field strength of 75 Gauss, with gas flows of 25 sccm $CF_4$, 35 sccm $CHF_3$, and 60 sccm Argon, and with helium backside cooling at a pressure of 7000 mTorr. This etch recipe etches both silicon nitride and silicon oxide, and is preferably used to etch through silicon nitride passivation layer 34, silicon oxide passivation layer 32, silicon oxide layer 30, and into, but not through, silicon oxide layer 26. The etch is preferably a timed etch performed for a time in the range of about 180 to 220 seconds.

The currently preferred method for performing the last step of etching with an etch process that is selective to silicon nitride includes etching in situ the same process chamber as the first etch step, but with process parameters of pressure of 175 mTorr, power of 435W, magnetic field strength of 75 Gauss, gas flows of 35 sccm $CF_4$, 90 sccm Argon, 16 sccm $CH_2F_2$, and 20 sccm $CHF_3$, and helium backside cooling at a pressure of 4500 mTorr.

Figure 3:
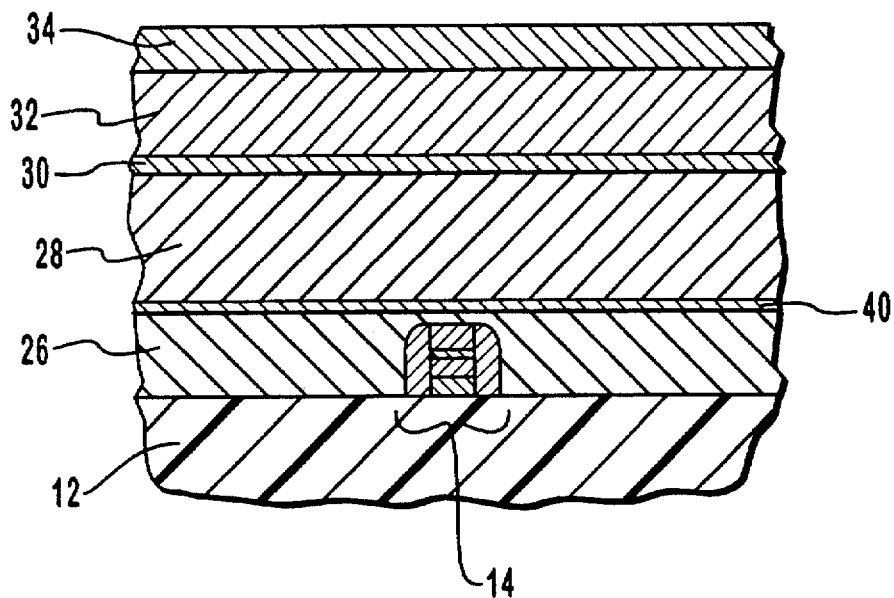
FIG. 3 is another cross section of a partially completed semiconductor device prepared for etching of a fuse opening according to the methods of the present invention.

FIG. 3 shows a cross section of structure identical to that of FIG. 1, except that a patch 40 is included in the overlying layers above gate stack 14. Patch 40 is preferably comprised of a material deposited during steps already performed during a standard fabrication process. Thus, to deposit patch 40, all that is required is that the mask at a certain step in the fabrication process be altered to allow patch 40 to be deposited, or to allow patch 40 to not be removed after deposition. Thus patch 40 may be incorporated without additional fabrication steps.

Patch 40 is preferably comprised of polysilicon or silicon nitride. Any suitable polysilicon layer or silicon nitride layer normally deposited after the formation of silicon oxide layer 26 may be employed. Thus patch 40 need not have exactly the location shown in FIG. 3, but may be located anywhere above gate stack 14 and below silicon nitride and silicon oxide passivation layers 34, 32. As currently most preferred, patch 40 is comprised of polysilicon that is deposited to form, on other areas of the wafer, the upper elements of stacked capacitors. This polysilicon, typically referred to as "cell poly," is not normally present above gate stack 14 in the fuse area, but may be used to form patch 40 over gate stack 14 by appropriate changes to the mask employed to pattern the cell poly. Thus the use of cell poly to form patch 40 is easily integrated into existing process flows. The use of cell poly to form patch 40 has the additional advantage of being deposited, in typical process flows, on a planarized surface, and hence it is flat, such that etch selectivity to the polysilicon surface is enhanced. It is also spaced away from the top the nitride cap over gate stack 14, such that the etch process used can easily be changed to an etch process selective to silicon nitride before nearing the nitride cap.

The embodiment of the present invention employed with the structure shown in FIG. 3 includes at least the following steps: (1) etching with an etch process selective to a material of which patch 40 is comprised, (2) etching with an etch process not selective to a material of which patch 40 is comprised, and (3) etching with an etch process selective to silicon nitride. If patch 40 is comprised of silicon nitride, an additional step of etching with an etch process that etches silicon nitride is required to be performed before step (1), above, in order to etch through silicon nitride passivation layer 34.

The embodiment of the present invention employed with the structure shown in FIG. 3 provides the advantages discussed above with respect to the embodiment described with reference to FIGS. 1 and 2. The embodiment of the present invention employed with the structure shown in FIG. 3 further provides the advantage of increasing the uniformity of the fuse opening etch depth across the surface of a wafer. The increased uniformity is achieved by including patch 40 above gate stack 14 and by etching, from sometime before the downward progression of the fuse opening reaches patch 40, with an etch process selective to a material of which patch 40 is comprised. The downward progress of the fuse opening then slows or stops at the level of patch 40.

Figure 4:
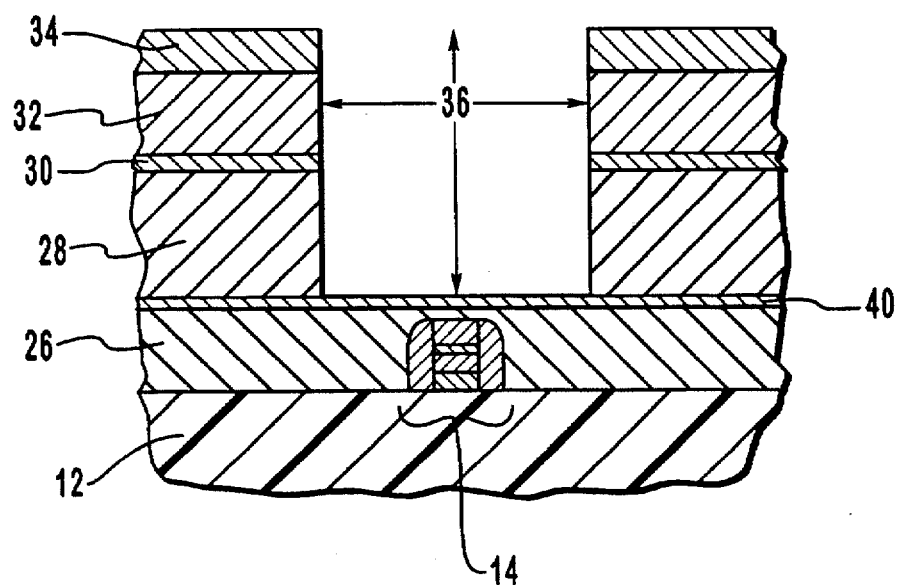
FIG. 4 is a cross section of the structure of FIG. 3 after partial etching of a fuse opening according to the methods of the present invention.

The downward progress of the fuse opening need not actually stop on the upper surface of patch 40 for patch 40 to have the desired effect. All that is required is that patch 40 etch at a slower rate than the overlying layers above patch 40. At the areas of the wafer where patch 40 is reached earliest, the slower etch rate of patch 40 allows other areas of the wafer to at least partly catch up, decreasing the variation in the depth of the etch. The effects of etching with an etch process selective to the material of which patch 40 is comprised are shown in FIG. 4. The downward progress of the partially completed fuse opening 36 is stopped or at least significantly slowed at patch 40.

Figure 5:
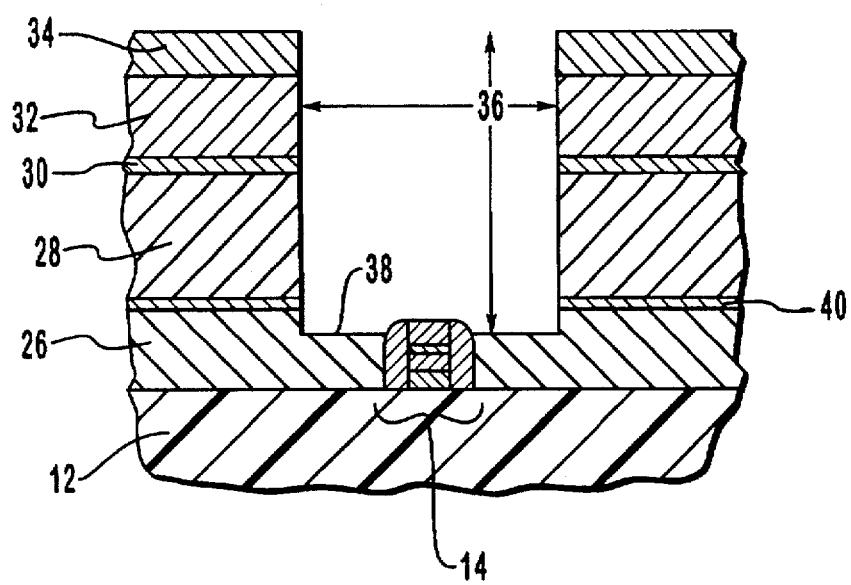
FIG. 5 is a cross section of the structure of FIG. 4 after completion of etching of a fuse opening according to the methods of the present invention.

At some time after the downward progress of a fuse opening somewhere on a wafer first reaches patch 40, and preferably some time before the downward progress of any fuse opening on the entire wafer reaches completely through patch 40, the step is commenced of etching with an etch process not selective to the material of which patch 40 is comprised. This step removes the remaining portions of patch 40 over the entire surface of the wafer, and allows further etching to proceed with more uniform etch depth. Last, the step of etching with an etch process selective to silicon nitride is performed until bottom 38 of fuse opening 36 is located somewhere within the acceptable range described above with reference to FIG. 2, such as the position of bottom 38 shown in FIG. 5. The actual target for the depth of the fuse opening is preferably at the center of the acceptable range. Additional etch steps may optionally be employed before patch 40 is reached, or before the nitride covering gate stack 14 is reached, or both, in order to increase the etch rates of the various layers to be removed.

The various steps of the embodiment of the present invention employed with the structure of FIGS. 3 and 4 may be performed in separate pieces of etch equipment, or may be performed in a single piece of etch equipment, or may preferably be performed in situ in a single process chamber by merely varying the process recipe appropriately.

The currently most preferred etch processes for performing the steps of the embodiment of the present invention employed with the structure of FIGS. 3 and 4 are as follows. Recipe one: in an Applied Materials 5000, etching through silicon nitride passivation layer 34, silicon oxide passivation layer 32, silicon oxide layer 30, and into, but not through, silicon oxide layer 28 with a process recipe of 150 mTorr pressure, 700W power, 75 Gauss magnetic field, gas flows of 25 sccm $CF_4$, 35 sccm $CHF_3$, and 60 sccm argon, and with helium backside cooling at a pressure of 7000 mTorr. This corresponds to the additional step employed to etch through nitride passivation layer 34. Recipe two: etching in situ but with a recipe of pressure of 175 mTorr, power of 435W, magnetic filed strength of 75 Gauss, gas flows of 35 sccm $CF_4$, 90 sccm argon, 16 sccm $CH_2F_2$, and 20 sccm $CHF_3$, and helium backside cooling at a pressure of 4500 mTorr. This etch step corresponds the step of etching with an etch process selective to a material of which patch 40 is comprised. This etch recipe is selective both to silicon nitride and to polysilicon, and so may be used with patches comprised of either material. Recipe three: etching in situ but with a recipe of 130 mTorr pressure, 225W power, 50 Gauss magnetic field strength, gas flows of 50 sccm $Cl_2$ and 10 sccm HBr, and helium backside cooling at a pressure of 4500 mTorr. This recipe etches polysilicon and corresponds to the step of etching with a process not selective to a material of which patch 40 is comprised, particularly if patch 40 is comprised of polysilicon. If patch 40 is comprised of silicon nitride, recipe one described above for the additional step may be used here as well. Recipe four: etching in situ, again with a recipe of pressure of 175 mTorr, power of 435W, magnetic filed strength of 75 Gauss, gas flows of 35 sccm $CF_4$, 90 sccm argon, 16 sccm $CH_2F_2$, and 20 sccm $CHF_3$, and helium backside cooling at a pressure of 4500 mTorr. Recipe four corresponds to the step of etching with an etch process selective to silicon nitride.

While the above etch processes are currently most preferred for performing the steps of the embodiment of the present invention employed with the structure of FIGS. 3 and 4, as an alternative preferred embodiment, if patch 40 is comprised of polysilicon, recipe one above may be used both to etch through silicon nitride passivation layer 34 and to stop or slow down at patch 40. Recipe one above would then correspond to the step of etching with an etch process selective to a material of which patch 40 is comprised. Then recipes three and four above would be used as described above, corresponding respectively to the steps of etching with an etch process not selective to a material of which patch 40 is comprised, and etching with an etch process selective to silicon nitride.

Figure 6:
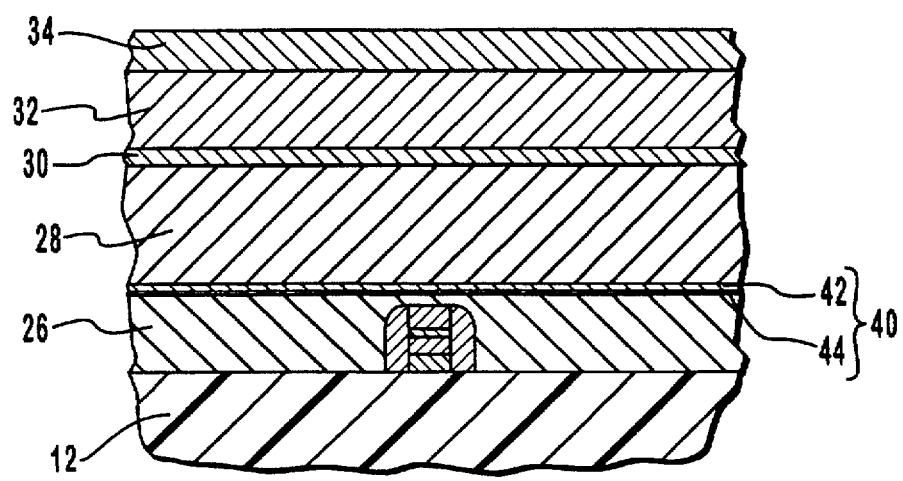
FIG. 6 is yet another cross section of a partially completed semiconductor device prepared for etching of a fuse opening according to the methods of the present invention.

FIG. 6 shows a cross section of structure identical to that of FIG. 3, except that a patch 40 includes two layers, layer 42 and layer 44. In a currently preferred embodiment, layer 42 is cell poly and layer 44 is a silicon nitride insulating layer that is patterned in the same step as the cell poly and hence is present in patch 40 with layer 44. Patch 40 is not limited to one or two layers or to one or two materials. All that is required is that: (1) during the step of etching with an etch process selective to a material of which patch 40 is comprised, at least one of the materials of patch 40 act as an etch stop, and, (2) that during the subsequent step of etching with an etch process not selective to the material of which patch 40 is comprised, the etch process used be not selective to the materials of which any remaining layers of patch 40 are comprised.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A method for etching a fuse opening during the manufacture of a semiconductor device, said method comprising the steps of:

providing a gate stack to serve as a fuse, said gate stack having spacers and a cap comprised of silicon nitride;
depositing overlying layers over said gate stack, said overlying layers having a top planar surface;
forming a mask upon said top planar surface;
forming an opening in said mask upon the top planar surface; and
etching a fuse opening in said overlying layers over said gate stack, including the step of etching an opening in said overlying layers through said opening in said mask on said top planar surface, beginning at some time before the downward progress of the opening reaches the gate stack, with an etch process selective to silicon nitride.

2. The method as defined in claim 1, wherein:
   (a) the step of depositing overlying layers over said gate stack comprises the step of depositing a nitride passivation layer over said gate stack; and
   (b) the step of etching a fuse opening in said overlying layers further comprises the step of etching an opening in said overlying layers beginning with an etch process that is not selective to silicon nitride.

3. The method as defined in claim 2, wherein the step of etching an opening in said overlying layers, beginning with an etch process that is not selective to silicon nitride, is performed by etching in a plasma etcher in a mixture of $CF_4$, $CHF_3$, and argon, following which the step of etching an opening in said overlying layers, beginning at a time before the downward progress of the opening reaches the gate stack, with an etch process selective to silicon nitride is performed.

4. The method as defined in claim 3, wherein the step of etching an opening in said overlying layers, beginning at a time before the downward progress of the opening reaches the gate stack, with an etch process selective to silicon nitride, comprises etching in a plasma etcher in a mixture of $CF_4$, argon, $CH_2F_2$, and $CHF_3$.

5. The method as defined in claim 2, wherein the step of etching an opening in said overlying layers, beginning at a time before the downward progress of the opening reaches the gate stack, with an etch process selective to silicon nitride, comprises etching in a plasma etcher in a mixture of $CF_4$, $CHF_3$, and argon.

6. The method as defined in claim 1, wherein the step of etching an opening in said overlying layers, beginning at a time before the downward progress of the opening reaches the gate stack, with an etch process selective to silicon nitride, comprises etching in a plasma etcher in a mixture of $CF_4$, argon, $CH_2F_2$, and $CHF_3$.

7. The method as defined in claim 1, wherein:
   (a) the step of depositing overlying layers over said gate stack comprises depositing a patch over said gate stack; and
   (b) the step of etching a fuse opening in said overlying layers further comprises the steps of:
      (i) etching an opening in said overlying layers, beginning at a time before the downward progress of the opening reaches the patch, with an etch process selective to a material of which said patch is comprised; and
      (ii) etching an opening in said overlying layers, beginning at a time after the downward progress of the opening reaches the patch, with an etch process not selective to said material of which said patch is comprised.

8. The method as defined in claim 7, wherein said patch comprises polysilicon.

9. The method as defined in claim 7, wherein said patch comprises silicon nitride.

10. The method as defined in claim 1, wherein all of said step of etching a fuse opening in said overlying layers is performed in situ in a single process chamber.

11. A method for etching a fuse opening during the manufacture of a semiconductor device, said method comprising the steps of:

provuding on a semiconductor substrate a conductive layer of polysilicon enclosed laterally by spacers and upwardly by a cap, said spacers and said cap being comprised of silicon nitride, said layer of polysilicon together with said cap and said spacers comprising a fuse;

depositing overlying layers over said fuse, including silicon oxide and silicon nitride passivation layers, said overlying layers having a top planar surface;

forming a mask upon said top planar surface;

forming an opening in said mask upon said top planar surface; and etching a fuse opening in said overlying layers over said fuse through said opening in said mask on said top planar surface, including the steps of:

etching an opening over said fuse for a first duration of time with an etch process not selective to silicon nitride; and etching said opening over said fuse for a second duration of time with an etch process selective to silicon nitride.

12. The method as defined in claim 11, wherein said first duration of time is selected so as to end before said opening extends to said silicon nitride cap.

13. The method as defined in claim 11, wherein said second duration of time is selected so as to end when the bottom of said opening extends to within the range of about 2000 Angstroms above said substrate to about 3000 Angstroms above said silicon nitride cap.

14. The method as defined in claim 11, wherein all of said step of etching a fuse opening in said overlying layers is performed in situ in a single process chamber.

15. A method for etching a fuse opening during the manufacture of a semiconductor device, said method comprising the steps of:

providing on a semiconductor substrate a conductive layer of polysilicon enclosed laterally by spacers and upwardly by a cap, said spacers and said cap being comprised of silicon nitride, said layer of polysilicon together with said cap and said spacers comprising a fuse;

depositing overlying layers over said fuse, said overlying layers having a top planar surface, including the step of:
depositing a patch over said fuse;

forming a mask upon said top planar surface;

forming an opening in said mask upon said top planar surface; and etching a fuse opening in said overlying layers over said fuse through said opening in said mask upon said top planar surface, including the steps of:

etching an opening over said fuse for a first duration of time with an etch process selective to a material of which said patch is comprised; and etching said opening over said fuse for a second duration of time with an etch process not selective to said material of which said patch is comprised.

16. The method as defined in claim 15, wherein:

(a) the step of depositing overlying layers over said fuse further includes the step of depositing a nitride passivation layer over said fuse; and (b) the step of etching an opening over said fuse for a first duration of time comprises etching an opening over said fuse for a first duration of time with an etch process selective to a material of which said patch is comprised and not selective to silicon nitride.

17. The method as defined in claim 15 wherein said patch is comprised of polysilicon.

18. The method as defined in claim 15 wherein the step of etching a fuse opening in said overlying layers over said fuse further comprises the step of etching said opening over said fuse for a third duration of time with an etch process selective to silicon nitride.

19. The method as defined in claim 15, wherein all of said step of etching a fuse opening in said overlying layers is performed in situ in a single process chamber.

20. A method for etching a fuse opening during the manufacture of a semiconductor device, said method comprising the steps of:

providing on a semiconductor substrate a conductive layer of polysilicon enclosed laterally by spacers and upwardly by a cap, said spacers and said cap being comprised of silicon nitride, said layer of polysilicon together with said cap and said spacers comprising a fuse;

depositing overlying layers over said fuse, said overlying layers having a top planar surface, including the step of:
depositing a patch over said fuse; and
depositing a nitride passivation layer over said fuse;

forming a mask upon said top planar surface;

forming an opening in said mask upon said top planar surface; and etching a fuse opening in said overlying layers over said fuse through said opening in said mask upon said top planar surface, including the steps of:

etching an opening over said fuse for a first duration of time with an etch process that etches silicon nitride;

etching said opening over said fuse for a second duration of time with an etch process selective to said material of which said patch is comprised; and etching said opening over said fuse for a third duration of time with an etch process not selective to said material of which said patch is comprised.

21. The method as defined in claim 20 wherein said patch is comprised of polysilicon.

22. The method as defined in claim 20, wherein the step of etching a fuse opening in said overlying layers over said fuse, further includes the step of:

(a) etching said opening over said fuse for a fourth duration of time with an etch process selective to silicon nitride.

23. The method as defined in claim 20, wherein said patch is comprised of silicon nitride.

24. The method as defined in claim 20, wherein all of said step of etching a fuse opening in said overlying layers is performed in situ in a single process chamber.

25. A etching method comprising:

providing a fuse composed of a conductive material, the conductive material having thereon spacers and a cap comprised of an insulative material;

depositing overlying layers over said fuse, said overlying layers having a top planar surface;

forming a mask upon said top planar surface;

forming a opening in said mask upon said top planar surface; and etching an opening in said overlying layers through said opening in said mask upon said top planar surface with an etch process selective to said insulative material prior to the opening reaching the cap on the fuse.

26. The method as defined in claim 25, wherein:
depositing said overlying layers over said fuse comprises depositing a passivation layer over said fuse; and
etching said opening in said overlying layers further comprises beginning etching of said opening with an etch process that is not selective to said insulative material.

27. The method as defined in claim 25, wherein:
depositing said overlying layers over said fuse comprises depositing a patch over said fuse; and
etching said opening in said overlying layers further comprises:
   etching with an etch process selective to a material of which said patch is comprised before the downward progress of the opening reaches the patch; and
   etching with an etch process not selective to said material of which said patch is comprised after the downward progress of the opening reaches the patch.

28. The method as defined in claim 27, wherein said patch comprises polysilicon.

29. The method as defined in claim 27, wherein said patch comprises said insulative material.

30. The method as defined in claim 1, wherein etching said opening in said overlying layers is performed in situ in a single process chamber.

31. The method as defined in claim 1, wherein said insulative material is substantially composed of silicon nitride.

32. A method for etching a fuse opening during the manufacture of a semiconductor device, said method comprising the steps of:
providing a semiconductor substrate;
providing a gate stack upon the semiconductor substrate to serve as a fuse, said gate stack having:
   an electrically conductive layer having lateral surfaces;
   a cap layer having an external exposed surface; and
   a spacer layer upon and in contact with the lateral surfaces of the electrically conductive layer, wherein spacer layer has an external exposed surface and extends from the semiconductor substrate to the cap layer, wherein the cap layer and the spacer layer are composed of silicon nitride, and wherein the spacer layer is adjacent to an exposed surface of the semiconductor substrate;
depositing overlying layers over said gate stack, upon the external exposed surface of the cap layer, upon the external exposed surface of the spacer layer, and upon the exposed surface of the semiconductor substrate such that the overlying layers enclose the cap layer and the spacer layer; and
etching a fuse opening in said overlying layers over said gate stack, including the step of etching an opening in said overlying layers, beginning at some time before the downward progress of the opening reaches the gate stack, with an etch process selective to silicon nitride such that the spacer layer remains in contact with electrically conductive layer, the electrically conductive layer is not exposed by the fuse opening.

33. The method as defined in claim 32, wherein the overlying layers have a top planar surface, the method further comprising, prior to etching a fuse opening in said overlying layers:
forming a mask upon said top planar surface;
forming an opening in said mask upon said top planar surface; and
wherein etching a fuse opening in said overlying layers further comprises etching the fuse opening through the opening in the mask upon the top planar surface.

34. A method for etching a fuse opening during the manufacture of a semiconductor device, said method comprising the steps of:
providing on a semiconductor substrate a conductive layer of polysilicon having lateral surfaces, said conductive layer having spacers on said lateral surfaces extending upwardly to a cap, said spacers and said cap each having an external exposed surface and being composed of silicon nitride, said layer of polysilicon together with said cap and said spacers comprising a fuse, wherein the spacers are adjacent to an exposed surface of the semiconductor substrate;
depositing overlying layers over said fuse, including silicon oxide and silicon nitride passivation layers, upon the external exposed surface of the cap layer, upon the external exposed surface of the spacer layer, and upon the exposed surface of the semiconductor substrate such that the overlying layers substantially cover up and enclose the cap layer and the spacer layer; and
etching a fuse opening in said overlying layers over said fuse such that the spacers remain in contact with conductive layer and the conductive layer is not exposed by the fuse opening, including the steps of:
   etching an opening over said fuse for a first duration of time with an etch process not selective to silicon nitride; and
   etching said opening over said fuse for a second duration of time with an etch process selective to silicon nitride.

35. The method as defined in claim 34, wherein the overlying layers have a top planar surface, the method further comprising, prior to etching a fuse opening in said overlying layers:
forming a mask upon said top planar surface;
forming an opening in said mask upon said top planar surface; and
wherein etching a fuse opening in said overlying layers further comprises etching the fuse opening through the opening in the mask upon the top planar surface.

36. A etching method comprising:
providing a semiconductor substrate;
providing a fuse situated upon the semiconductor substrate and composed of a conductive material, the conductive material having thereon spacers extending upwardly to a cap, the spacers and the cap each having an external exposed surface and being composed of silicon nitride, wherein the spacers are adjacent to an exposed surface of the semiconductor substrate;
depositing overlying layers upon the external exposed surface of the cap layer, upon the external exposed surface of the spacer layer, and upon the exposed surface of the semiconductor substrate such that the overlying layers enclose the cap layer and the spacer layer; and
etching an opening in said overlying layers with an etch process selective to said insulative material prior to the opening reaching the cap on the fuse such that the spacers remain in contact with the conductive material of the fuse and the conductive material is not exposed by the opening.

37. The method as defined in claim 36, wherein the overlying layers have a top planar surface, the method further comprising, prior to etching an opening in said overlying layers:

forming a mask upon said top planar surface;

forming an opening in said mask upon said top planar surface; and wherein etching an opening in said overlying layers further comprises etching the opening in said overlying layers through the opening in the mask upon the top planar surface.

38. A method for forming an opening to a fuse, the method comprising:

providing a semiconductor substrate;

providing a fuse on the semiconductor substrate, the fuse including an electrically conductive material, and the fuse having an exposed external surface thereon;

forming a covering composed of silicon nitride over the fuse and extending to the semiconductor substrate so as to cover the exposed external surface of the fuse, wherein:

the covering is in contact with the electrically conductive material;

the covering has an exposed external surface thereon that is adjacent to an exposed surface of the semiconductor substrate;

forming overlying layers upon the external exposed surface of the covering and upon the exposed surface of the semiconductor substrate such that the overlying layers enclose the covering;

forming an opening in said overlying layers such that:

the covering remains in contact with the electrically conductive material of the fuse;

the conductive material is not exposed by the opening; and the semiconductor substrate is not exposed by the opening.

39. The method as defined in claim 38, wherein the overlying layers have a top planar surface, the method further comprising, prior to etching an opening in said overlying layers:

forming a mask upon said top planar surface;

forming an opening in said mask upon said top planar surface; and wherein etching an opening in said overlying layers further comprises etching the opening in said overlying layers through the opening in the mask upon the top planar surface.

40. A method for forming an opening to a fuse, the method comprising:

providing a semiconductor substrate;

providing a fuse on the semiconductor substrate, the fuse including an electrically conductive material;

forming a covering composed of an electrically insulative material over the fuse and extending to the semiconductor substrate so as to substantially cover the fuse, wherein:

the covering is in contact with the electrically conductive material; and the covering has an exposed external surface thereon;

forming overlying layers upon the external exposed surface of the covering and upon the semiconductor substrate such that the overlying layers substantially cover up and enclose the covering, the overlying layers having a top planar surface;

forming a mask upon said top planar surface;

forming an opening in said mask upon said top planar surface;

forming an opening in said overlying layers through the opening in the mask upon the top planar surface such that:

the covering remains in contact with the electrically conductive material of the fuse;

the conductive material is not exposed by the opening; and the semiconductor substrate is not exposed by the opening.

41. The method as defined in claim 40, wherein the semiconductor substrate has a top most surface upon which the fuse is situated, wherein the opening terminates not less than 2000 Angstroms above the top most surface of the semiconductor substrate.

42. The method as defined in claim 40, wherein the covering has a top most surface upon which the overlying layer are situated, wherein the opening terminates not more than 3000 Angstroms above top most surface of the covering.

43. The method as defined in claim 40, wherein:

the semiconductor substrate has a top most surface upon which the fuse is situated;

the covering has a top most surface upon which the overlying layer are situated; and the opening terminates:

not less than 2000 Angstroms above the top most surface of the semiconductor substrate; and not more than 3000 Angstroms above top most surface of the covering.

44. The method as defined in claim 40, wherein the fuse further comprises a metal silicide layer and oxide layer.

45. The method as defined in claim 40, forming overlying layers over said covering comprises:

forming an insulative layer upon the semiconductor substrate and upon the covering;

forming a capacitor plate composed of an electrically conductive material.

46. The method as defined in claim 45, wherein the capacitor plate is composed of polysilicon.

47. The method as defined in claim 40, wherein forming overlying layers over said covering comprises:

forming an insulative layer composed silicon oxide upon the covering;

forming a patch upon the insulative layer, wherein the patch is composed of a material selected from the group consisting of silicon nitride and polysilicon, wherein the insulative layer separates the covering from the patch.

48. The method as defined in claim 40, wherein the covering is composed of silicon nitride.

* * * * *

UNITED STATES PATENT AND TRADEMARK OFFICE
CERTIFICATE OF CORRECTION

PATENT NO. : 5,895,262
DATED : Apr. 20, 1999
INVENTOR(S) : David S. Becker; Kunal R. Parekh It is certified that error appears in the above-identified patent and that said Letters Patent is hereby corrected as shown below:

Col. 2, line 11, after "of a" change "wafers" to --wafer--

Col. 7, line 3, after "magnetic" change "filed" to --field--

Col. 7, line 20, after "magnetic" change "filed" to --field--

Col. 10, line 26, after "including the" change "step" to --steps--

Col. 10, line 64, after "forming" change "a" to --an--

Col. 14, line 25, before "are" change "layer" to --layers--

Col. 14, line 26, after "above" insert --the--

Col. 14, line 32, after "overlying" change "layer" to --layers--

Col. 14, line 51, after "composed" insert --of--

Signed and Sealed this

Twenty-eighth Day of March, 2000

Attest:

Q. TODD DICKINSON

*Attesting Officer*  *Commissioner of Patents and Trademarks*